US 7,714,654 B2

(12) United States Patent
Ryynänen et al.

(10) Patent No.: US 7,714,654 B2
(45) Date of Patent: *May 11, 2010

(54) AMPLIFIER AND AMPLIFIER GAIN ADJUSTMENT CIRCUITRY USING CURRENT STEERING, AND MULTIMODE COMMUNICATION DEVICE CONTAINING SAME

(75) Inventors: Jussi Ryynänen, Helsinki (FI); Jarkko Jussila, Helsinki (FI)

(73) Assignee: Nokia Corporation, Espoo (FI)

( * ) Notice: Subject to any disclaimer, the term of this patent is extended or adjusted under 35 U.S.C. 154(b) by 648 days.

This patent is subject to a terminal disclaimer.

(21) Appl. No.: 11/657,773

(22) Filed: Jan. 24, 2007

(65) Prior Publication Data

US 2007/0132511 A1    Jun. 14, 2007

Related U.S. Application Data

(63) Continuation of application No. 11/314,998, filed on Dec. 23, 2005, now Pat. No. 7,170,350, which is a continuation of application No. 10/476,788, filed as application No. PCT/EP01/05220 on May 8, 2001, now Pat. No. 6,980,051.

(51) Int. Cl.
  *H03F 3/45*  (2006.01)
  *H04B 1/16*  (2006.01)
  *H04M 1/00*  (2006.01)

(52) U.S. Cl. ............... 330/254; 455/200.1; 455/552.1

(58) Field of Classification Search ........... 455/552.1, 455/553, 127.4, 251.1, 253.2, 200.1; 330/252, 330/254, 305
See application file for complete search history.

(56) References Cited

U.S. PATENT DOCUMENTS 5,115,373  A  *  5/1992  Takeda ..................... 361/329
5,179,292  A       1/1993  Lee ........................... 307/255
5,959,582  A  *  9/1999  Kawahata et al. ..... 343/700 MS (Continued)

FOREIGN PATENT DOCUMENTS

EP         1003287 A1  *  5/2000

(Continued)

OTHER PUBLICATIONS

Ryynanen, J. et al., "A Dual-Band RF Front-End for WCDMA and GSM Applications", IEEE 2000 Custom Integrated Circuits Conference, pp. 175-178, XP002902218.

*Primary Examiner*—Dwayne Bost
*Assistant Examiner*—Larry Sternbane
(74) *Attorney, Agent, or Firm*—Harrington & Smith

(57) ABSTRACT

Disclosed is a multi-mode radio frequency amplifier. The amplifier includes a plurality of input transistors, a plurality of output branches, and a switching stage interposed between the plurality of input transistors and the plurality of output branches for selectively connecting the plurality of input transistors to the plurality of output branches. Individual ones of operational modes of the multi-mode amplifier correspond to an individual one of the plurality of frequency selective loads. A particular one of the plurality of frequency selective loads is one of operating or non-operating during operation of the multi-mode amplifier. A gain of the multi-mode amplifier is reduced by controlling the plurality of elements to steer a predetermined portion of a total signal current that is output from one of the input transistors, from an associated operating frequency selective load to a non-operating frequency selective load.

28 Claims, 2 Drawing Sheets

U.S. PATENT DOCUMENTS

| | | | |
|---|---|---|---|
| 5,969,582 A * | 10/1999 | Boesch et al. | 333/129 |
| 6,100,759 A * | 8/2000 | Sirna et al. | 330/252 |
| 6,133,793 A * | 10/2000 | Lau et al. | 330/302 |
| 6,172,566 B1 | 1/2001 | Nguyen | 330/254 |
| 6,373,337 B1 | 4/2002 | Ganser | 330/252 |
| 6,621,343 B2 | 9/2003 | Hart | 330/254 |
| 6,980,051 B2 * | 12/2005 | Ryynanen et al. | 330/254 |
| 7,170,350 B2 * | 1/2007 | Ryynanen et al. | 330/254 |

FOREIGN PATENT DOCUMENTS

| | | |
|---|---|---|
| EP | 1 006 669 A1 | 6/2000 |
| EP | 1 096 697 A2 | 5/2001 |

\* cited by examiner

US 7,714,654 B2

AMPLIFIER AND AMPLIFIER GAIN ADJUSTMENT CIRCUITRY USING CURRENT STEERING, AND MULTIMODE COMMUNICATION DEVICE CONTAINING SAME

CROSS-REFERENCE TO A RELATED APPLICATION

This patent application is a continuation of U.S. patent application Ser. No. 11/314,998, filed Dec. 23, 2005, now U.S. Pat. No. 7,170,350 which is a continuation of U.S. patent application Ser. No. 10/476,788, filed Nov. 6, 2003, now U.S. Pat. No. 6,980,051 which is a 371 application of International Application PCT/EP01/05220, filed May 8, 2001, each of which is incorporated by reference herein in its entirety.

FIELD OF THE INVENTION

The present invention relates to a gain adjusting method and circuit arrangement for performing a gain adjustment e.g. in a radio frequency (RF) part of a radio receiver, integrated circuits, or a multi-mode and multi-band system.

BACKGROUND OF THE INVENTION

In general, mobile communication systems such as GSM (Global System for Mobile Communication), GPRS (General Packet Radio Services) or UMTS (Universal Mobile Communications System) are designed to provide international digital cellular services. Originally, in GSM, the 900-MHz band was reserved for GSM services, wherein the frequency band from 890 to 915 MHz was reserved for the uplink direction, i.e. sending data from a mobile station or terminal to a base station, and the frequency band from 935 to 960 MHz was reserved for the downlink direction, i.e. sending data from the base station to the mobile station or terminal. Since GSM first entered commercial service in 1992, it has been adapted to work at 1800 MHz for the Personal Communications Networks (PCN) in Europe and at 1900 MHz for Personal Communications Systems (PCS) in the United States. Accordingly, there exist three main GSM systems operating at three different receiving frequency bands. Hence, a mobile station covering all these systems has to be switchable between the different receiving frequency bands to be operable in different areas having different GSM standards.

Conventional receiver front ends comprise multiple low-noise amplifiers and multiple mixers, wherein the number of low-noise amplifiers and mixers correspond to the number of different receiving frequency bands which have to be received by the mobile station. For instance, within a mobile station designed to receive a broadcast signal in the downlink frequency bands of GSM 900, GSM 1800 and GSM 1900, three different low-noise amplifiers and three different mixers have to be employed. This leads to the drawback that many components have to be integrated within a mobile station, thus increasing its total production cost and making a further miniaturization difficult.

A solution to the above problem was supposed in document BP 1 006 669 A1, where a wide-band low-noise amplifier is connected to a broadcast signal receiving means in order to amplify the broadcasted signals of all receiving frequency bands, and an amplified output signal is branched to multiple switches of a switching means, wherein the number of the switches corresponds to the number of receiving frequency bands. Multiple filters each connected to one of the switches are provided, each filter having a band pass filtering characteristic to pass all signals within an associated receiving frequency band. Furthermore, a mixing means is connected to the output side of each filter and arranged to mix the filter signal with locally generated mixing signal from a frequency synthesizer to produce an intermediate frequency signal. The switching means is arranged to switch on one of the switches based on a first control signal supplied from a control means so as to switch on one of the switches and thereby select one of the multiple receiving frequency bands. A second control signal is supplied from the control means to the frequency synthesizer to generate a mixing signal corresponding to the selected receiving frequency band.

In multi-band and multi-system receivers there is usually a need for different loads. The loads are usually frequency selective, e.g. resonators or the like, and are thus tuned according to the reception frequencies of individual systems, as mentioned above. When a gain adjustment is to be performed in the RF part of receivers, a gain control circuitry can be based on current splitting, wherein dummy branches were proposed to be used to provide the current splitting function.

FIG. 2 shows such a gain control circuitry in a single-band single-system receiver, where a part of the output current of an input stage 10 of a low-noise amplifier is switched by a switching means 20 to a dummy branch which is connected to a supply voltage ($V_{DD}$). It is noted that the dummy branch may be connected to any suitable potential or device. The portion switched to the dummy branch can be determined or controlled by selecting a number of parallel switches of the switching means 20, which is to be switched to the dummy branch. The remaining part of the output current is supplied to a load Z1 and an output terminal OUT1. The load Z1 may be a frequency selective load tuned to the receiving frequency band of the single-band single-system receiver. However, using this kind of solution in multi-mode and multi-band receiver systems would require a plurality of dummy branches which leads to an increased number of components, thus increasing production costs and size of implementation.

SUMMARY OF THE INVENTION

It is therefore an object of the present invention to provide a gain adjusting method and circuit arrangement, by means of which a gain control function can be introduced in multi-band systems at low production costs and facilitated miniaturization.

This object is achieved by a method for adjusting a gain in a circuit arrangement comprising at least a first output branch connected to a first load and a second output branch connected to a second load, the method comprising the steps of:

providing a first operation mode in which the first output branch is operated and the second output branch is not operated, and a second operation mode in which the first output branch is not operated and the second output branch is operated;

providing a switching function for switching a predetermined portion of the branch current of one of the first and second output branches to the other of the first and second output branches; and adjusting the gain in at least one of the first and second operation modes by changing the predetermined portion of the output current.

Furthermore, the above object is achieved by circuit arrangement for performing a gain adjustment, the circuit arrangement comprising:

a first branch connected to a first load, the first branch being operated in a first operating mode of the circuit arrangement and being not operated in a second operating mode of the circuit arrangement;

a second branch connected to a second load, the second branch being operated in the second operating mode and being not operated in the first operating mode;

switching means for switching a predetermined portion of the branch current of one of the first and second output branches to the other one of the first and second output branches to the other one of the first and second output branches; and adjusting means for adjusting the gain by changing the predetermined portion.

Accordingly, the number of parallel switched branches can be reduced in multi-band or multi-system receivers compared to typical gain adjustment circuits based on current splitting, since loads related to non-operational output branches are utilized for receiving a portion of the output current of the operational or operated output branch. Thus, the signal current is split up into a first part directed to an operational output branch and a second part directed to one or a plurality of the non-operational output branches. Depending on the ratio between the current portions, the gain of the concerned receiver circuit part can be controlled or determined, since the effective load reflected at the output of the circuit arrangement is changed according to the ratio of the above mentioned current portions.

The adjusting step may be performed by controlling individual switching elements of the switching function, so as to determine the predetermined portion. In particular, the individual switching elements may be controlled by selectively supplying a control signal to control terminals of the individual switching elements.

The circuit arrangement may be comprised in a dual-band receiver, wherein the first operating mode is provided to receive a first frequency band and a second operating mode is provided to receive a second frequency band. In this case, the first and second loads may be frequency-selective loads tuned to the first and second frequency band, respectively. The circuit arrangement may be a low-noise amplifier of the dual-band receiver.

Furthermore, the switching means may comprise a plurality of parallel switching elements arranged to supply their switched current either to the first output branch or to the second output branch. In particular, the parallel switching elements may be transistor means. Then, the adjusting means may comprise switching means for switching a control signal to the transistor means. The transistor means may be transistor pairs.

BRIEF DESCRIPTION OF THE DRAWINGS

In the following, the present invention will be described in greater detail based on preferred embodiments with reference to the drawing figures, in which.

DESCRIPTION OF THE PREFERRED EMBODIMENTS

The preferred embodiments will now be described on the basis of a low-noise amplifier provided in an RF part of a dual-band radio receiver.

Figure 1:
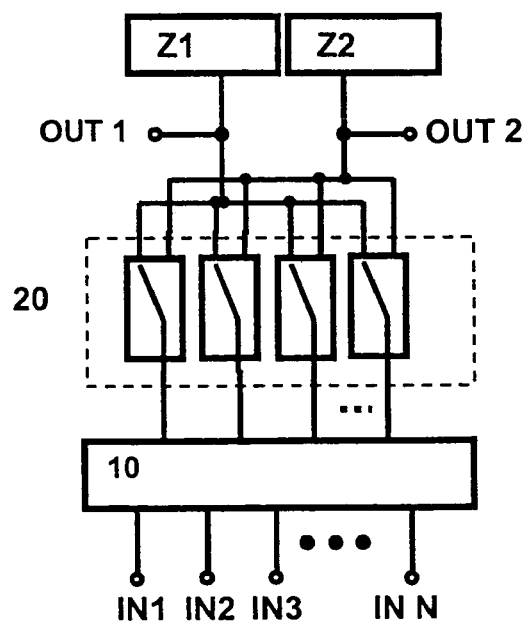
FIG. 1 shows a schematic block diagram of a low-noise amplifier according to the preferred embodiments of the present invention.
Figure 2:
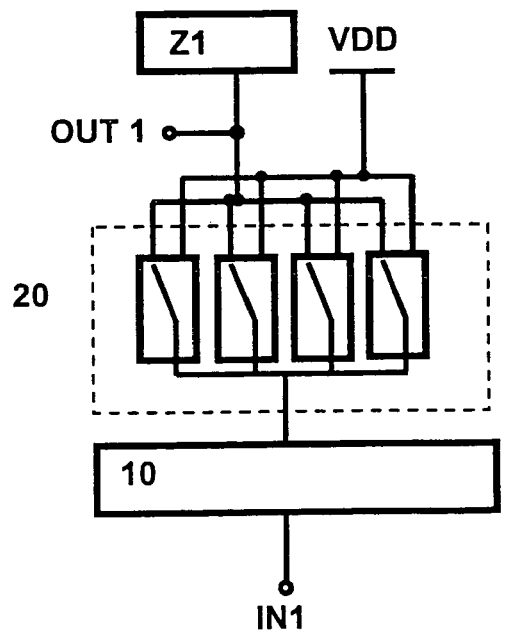
FIG. 2 shows a schematic block diagram of a low-noise amplifier gain adjustment based on current steering.

FIG. 1 shows a schematic block diagram of the low-noise amplifier according to the first preferred embodiment with two output terminals OUT1, OUT2 and N input terminals IN1 to INN. The low-noise amplifier comprises an input stage 10 comprising the N input terminals IN1 to INN, to which N individual input signals can be applied. The gain of the low-noise amplifier can be adjusted by a switching stage 20 comprising a plurality of switching elements for switching respective output signals of the input stage either to a first output branch connected to a first load Z1 or to a second output branch connected to a second load Z2. The first output branch comprises a first output terminal OUT1 for outputting an output signal corresponding to the first output branch, and the second output branch comprises a second output terminal OUT2 for outputting an output signal of the second output branch. In case of a dual-band receiver arrangement. The first load Z1 may be a first frequency-selective load, e.g. a resonance circuit or the like, and the second load Z2 may be a second frequency-selective load, e.g. a resonance circuit or the like.

By selectively switching the switching elements of the switching stage 20, the portions of the total output signal or current supplied to the respective output branches can be determined. Thereby, the effective loads responsible for the signal gains obtained at the output terminals OUT1, OUT2 can be adjusted or controlled.

It is noted that the current splitting may as well be implemented as an analogue or continuous value current splitting. In this case, in FIG. 1, all switches of the switching stage 20 except one can be removed. The remaining switch may then be controlled in a way that the total current is split into two predetermined portions which are supplied to the respective output branches. For example, three cases are then possible: 1) the total current through the switch is flowing through the first load Z1; 2) the current portion through the first load Z1 is decreased and the current portion through the second load Z2 is increased; or 3) the total current through the switch is flowing through the second load Z2. In this way, the signal gain of the amplifier can be controlled in an analogue manner (no discrete steps).

Due to the fact that only one of the two output branches is operated, while the other one is not operated (e.g. based on the received frequency band), the non-operated output branch can be used as a kind of dummy load branch for the operated output branch. Thus, the required number of output branches for implementing a gain adjustment function can be halved, which makes the layout design easier and the control and biasing of dummy branches are not needed.

The loads Z1, Z2 of the first and second output branches' may be band-pass filters with a filtering characteristic to pass signals within a downlink receiving frequency band of the respective receiving frequency band. In particular, the loads may be resonance circuit with a discrete capacity or inductivity, surface acoustic wave filters, dielectric filters, or other frequency-selective elements or circuits.

Furthermore, a control unit (not shown) may be provided which automatically detects the receiving frequency band on which data is received from a transmitting side, and which generates control signals supplied to the switching stage 20 to indicate which of the output branches is to be operated and which is to be not operated. Furthermore, another control signal may be generated to control a local oscillator signal required for down-converting the frequency of the received radio signal in accordance with the respective downlink receiving frequency band.

By switching a part of the output signal current to the non-operational output branch, the gain of the low-noise amplifier can be reduced.

Figure 3:
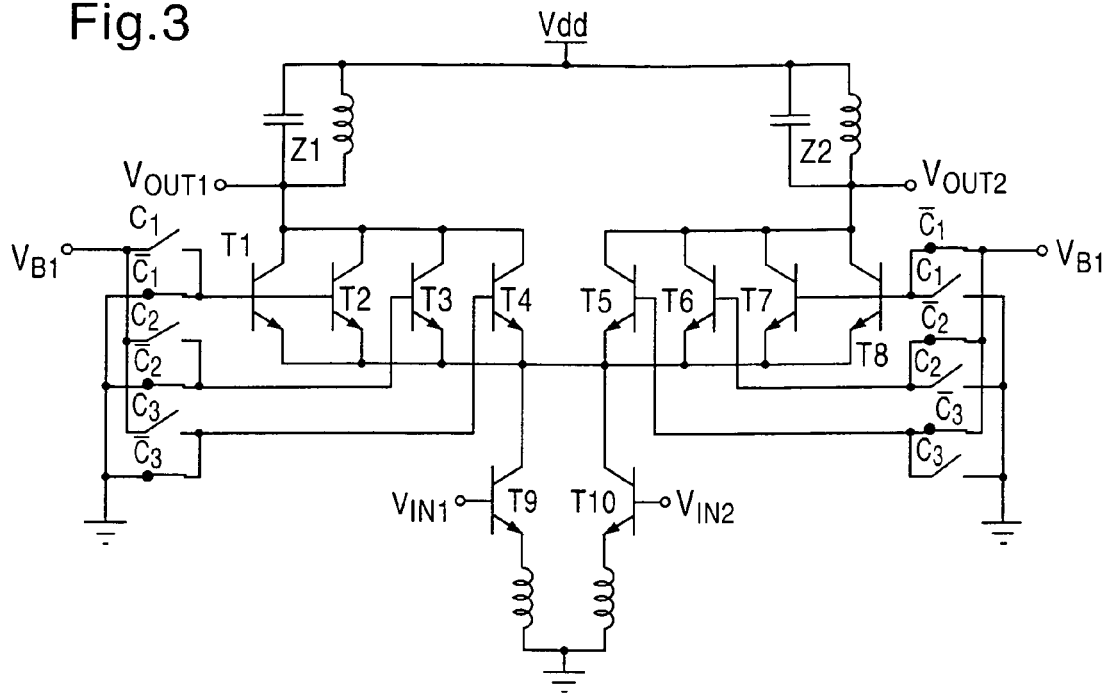
FIG. 3 shows a schematic circuit diagram of a possible implementation of the low-noise amplifier according to a first preferred embodiment.

FIG. 3 shows a possible implementation of the low-noise amplifier circuit according to the first preferred embodiment. In FIG. 3, the loads Z1, Z2 of the first and second output branches are connected to a supply voltage $V_{DD}$ and are formed by parallel resonance circuits. The switching stage 20 comprises an arrangement of four parallel transistors T1 to T4 for switching a respective part of the output current of the first output branch and four parallel transistors T5 to T8 for switching a respective part of the output current of the second output branch the four transistors T1 to T4 allocated to the first output branch are controlled at their base terminals by corresponding switching elements C1 to C3 for supplying a base control voltage $V_{B1}$ to the base terminals, and by switching elements $\overline{C1}$ to $\overline{C3}$ for switching a ground potential to the base terminals. It is noted that the switching elements C1 to C3 and $\overline{C1}$ to $\overline{C3}$ are adapted in such a manner that the switching state of the switching elements $\overline{C1}$ to $\overline{C3}$ is inverse or opposite to the switching state of the switching elements C1 to C3. The same applies to the transistors T5 to T8 allocated to the second output branch, wherein the switching elements $\overline{C1}$ to $\overline{C3}$ are arranged to switch a base control voltage $V_{B1}$ to the base terminals, and the switching elements C1 to C3 are arranged to switch ground potential to the base terminals. Thus, the states of the transistors T5 to T8 are opposite to the respective states of the transistors T1 to T4.

For example, if the transistor T1 is in a conducting state by closing the switching element C1 (opening the switching element $\overline{C1}$), then the transistor T8 is in a non-conducting state, since ground potential is applied via the switching element $C_1$ to the base control terminal of the transistor T8. The same applies to the other transistors.

The low-noise amplifier shown in FIG. 3 is arranged as a single-ended structure with two inputs, where the input voltages $V_{IN1}$ and $V_{IN2}$ are supplied to respective input transistors T9 and T10, respectively, which are connected via corresponding inductors to ground potentials. The inductors are used for matching purposes in connection with a base inductance (not shown) of the respective one of the transistors T9 and T10. E.g., the input impedance of the low-noise amplifier can be matched to 50Ω as required by a preceding pre-selection filter or duplexer.

The switching elements C1 to C3 and $\overline{C1}$ to $\overline{C3}$ of the first output branch and the switching elements C1 to C3 and $\overline{C1}$ to $\overline{C3}$ of the second output branch may be chemically or electronically coupled to ensure synchronism and equal switching states.

Thus, depending on the switching state of the switching elements of C1 to C3 and $\overline{C1}$ to $\overline{C3}$, which may be controlled by supplying binary control signals to corresponding electronical or logical switching elements, the state of the transistors T1 to T8 can be controlled. Thereby, the output current of the low-noise amplifier can be distributed in a predetermined ratio to the two output branches, to thereby determine and adjust the gain of the operational output branch. E.g., if all transistors T1 to T4 are switched on, which corresponds to a closed switch, the maximum output current is supplied to the first output branch and thus to the load Z1. On the other hand, if all transistors T5 to T8 are switched on, i.e. switch closed, the maximum output current is supplied to the second output branch and the second load Z2.

As already mentioned in connection with FIG. 1, an analogue or continuous value current splitting may be provided. In FIG. 3, this could be provided by removing all switching transistors except T1 and T8. The base voltage of these two transistors T1 and T8 could then be controlled to achieve the desired current splitting portions. If the base control voltages $V_{B1}$ applied to the transistors T1 and T8 are the same, an equal signal current portion flows through the transistors T1 and T8. If one of the base control voltages of the transistors T1 or T8 is lowered, a greater signal current portion will flow through the other transistor and hence through the other output branch.

Figure 4:
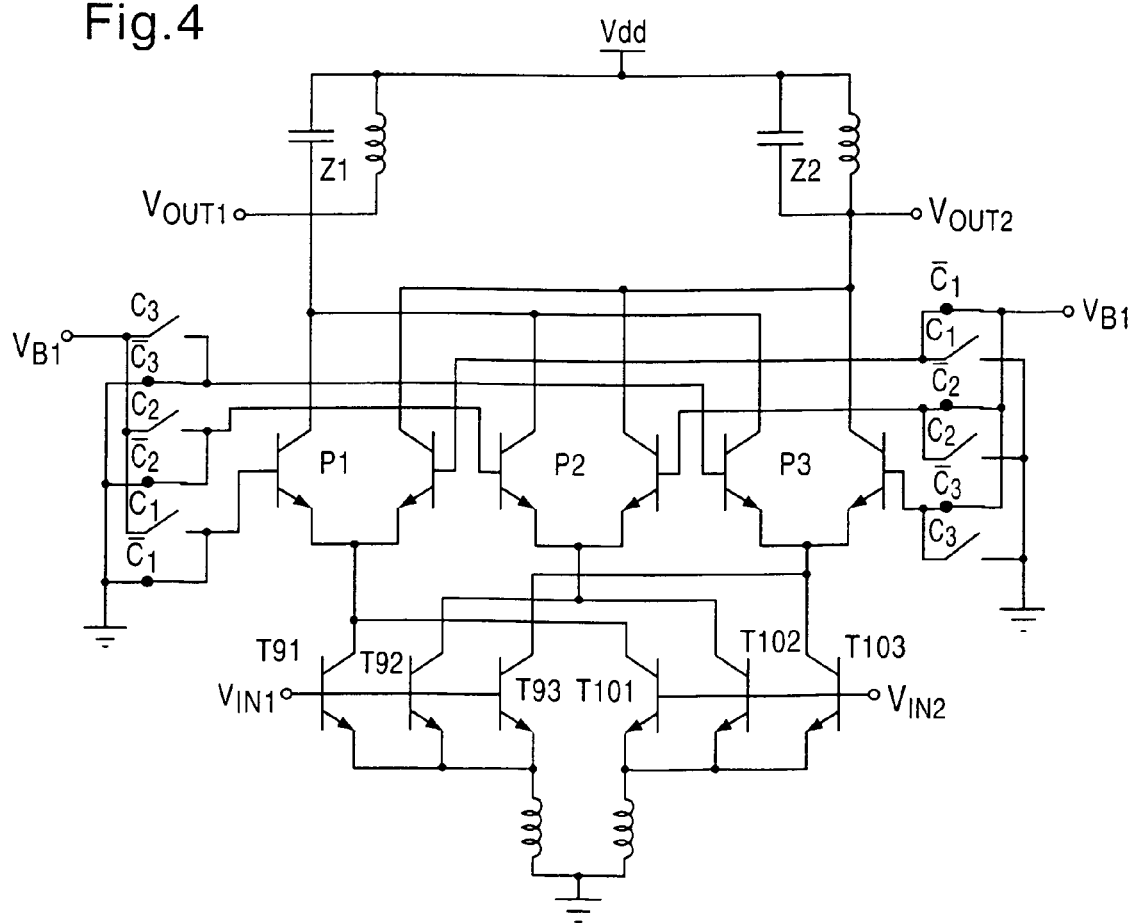
FIG. 4 shows a schematic circuit diagram of another possible implementation of the low-noise amplifier according to a second preferred embodiment.

FIG. 4 shows another implementation of the low-noise amplifier according to the second preferred embodiment. In the present case, the transistors T1 to T8 are replaced by corresponding transistor pairs P1 to P3, wherein one transistor of the transistor pair is connected to the first output branch and controlled by the corresponding switching elements C1 to C3 and $\overline{C1}$ to $\overline{C3}$, and wherein the second transistor of the transistor pairs P1 to P3 is connected with its collector terminal to the second output branch and controlled by the corresponding switching elements C1 to C3 and $\overline{C1}$ to $\overline{C3}$ allocated to the second output branch. Both transistors of each transistor pair P1 to P3 are connected at their emitter terminals. The emitter terminals of the transistors of the transistor pairs P1 to P3 are connected to a corresponding pair of transistors T91 and T101, T92 and T102, T93 and T103, wherein the input voltage $V_{IN1}$ is supplied to the base terminal of one transistor of the transistor pairs, and the input voltage $V_{IN2}$ is supplied to the base terminal of the other transistor of the transistor pairs.

According to the arrangement shown in FIG. 4, one of the transistors of the transistor pairs P1 to P3 is in the non-conducting state and the other one is in the conducting state, such that the corresponding part of the output current is either supplied to the first output branch or supplied to the second output branch. Thereby, the output current supplied to the operated output branch can be controlled by the switching elements C1 to C3 and $\overline{C1}$ to $\overline{C3}$ to thereby adjust the gain of the low-noise amplifier, similar to the first embodiment. In the case of the maximum gain, the entire signal current is supplied to the operational output branch. By switching or steering a part of the signal current to the non-operational output, the gain can be lowered. In the case shown in FIG. 4, the input transistors T91 to T93 and T101 to T103 are divided into three parts and the signal current of these individual transistors is controlled by the differential transistor pairs P1 to P3. The first input signal $V_{IN1}$ is supplied to the base terminals of the transistors T91 to T93, and the second input signal $V_{IN2}$ is supplied to the base terminals of the transistors T101 to T103.

In summary, a method and circuit arrangement for adjusting a gain is described, wherein said circuit arrangement comprises at least a first output branch connected to a first load and a second output branch connected to a second load. The gain control function is realized based on a current splitting, wherein a non-operated output branch is used as a kind of dummy branch for receiving a part of the output current. Thus, only as many output branches as there are outputs are required to implement a gain control based on splitting. Thereby, a complexity of the layout design is reduced and control and biasing of dummy branches is not required.

It is noted, that the present invention is not restricted to the first and second embodiments and mobile communication systems described above and can be applied to any circuit arrangement in any system, where an operational output branch and a non-operational output branch are provided. The described gain adjusting function may as well be used in balanced or differential structures where the two input signals have a 180 degree phase shift to each other. The number of input transistors can be increased if more inputs are required. In general, the arrangement of the input stage can be replaced with any suitable structure which provides the required or desired signal to the switching stage 20. The range of the controllable gain depends on the number of parallel differential transistor pairs and can be increased as desired. Additionally, further output branches can be added, e.g. if more than two receiving frequency bands are provided. Hence, the number of inputs and outputs must not be equal. The bipolar transistors can be replaced by any type of transistor or other suitable switching elements. Thus, the present invention may vary within the scope of the attached claims.

The invention claimed is:

1. A multi-mode radio frequency amplifier, comprising:
   a plurality of input transistors;
   a plurality of output branches each comprising a frequency selective load; and
   a switching stage interposed between said plurality of input transistors and said plurality of output branches for selectively coupling said plurality of input transistors to said plurality of output branches, said switching stage comprising a plurality of elements;
   where individual ones of operational modes of the multi-mode amplifier correspond to an individual one of said plurality of frequency selective loads, and where a particular one of said plurality of frequency selective loads is one of operating or non-operating during operation of said multi-mode amplifier; and
   where a gain of said multi-mode amplifier is reduced by controlling said plurality of elements to steer a predetermined portion of a total signal current, that is output from one of said input transistors, from an associated operating frequency selective load to a non-operating frequency selective load.

2. The multi-mode radio frequency amplifier according to claim 1, where a first one of said plurality of frequency selective loads comprises a bandpass filter having a filtering characteristic to pass signals within a first receiving frequency band, and where a second one of said plurality of frequency selective loads comprises a bandpass filter having a filtering characteristic to pass signals within a second receiving frequency band.

3. The multi-mode radio frequency amplifier according to claim 1, where individual ones of said frequency selective loads comprise a resonant circuit comprised of at least one capacitance and at least one inductance.

4. The multi-mode radio frequency amplifier according to claim 1, where individual ones of said frequency selective loads comprise a surface acoustic wave filter.

5. The multi-mode radio frequency amplifier according to claim 1, where individual ones of said frequency selective loads comprise a dielectric filter.

6. The multi-mode radio frequency amplifier according to claim 1, where a terminal of individual ones of said plurality of input transistors is connected to ground via an associated inductance.

7. The multi-mode radio frequency amplifier according to claim 1, where individual ones of said plurality of input transistors are comprised of a plurality of parallel connected transistors.

8. The multi-mode radio frequency amplifier according to claim 1, where individual ones of said plurality of elements are comprised of a transistor.

9. The multi-mode radio frequency amplifier according to claim 1, where individual ones of said plurality of elements are comprised of a transistor pair.

10. The multi-mode radio frequency amplifier according to claim 1, where said plurality of elements are controlled by binary control signals.

11. The multi-mode radio frequency amplifier according to claim 1, where said plurality of elements are controlled by control voltages.

12. The multi-mode radio frequency amplifier according to claim 1, where a differential input signal is applied to input terminals of said input transistors.

13. The multi-mode radio frequency amplifier according to claim 1, embodied in a mobile terminal.

14. The multi-mode radio frequency amplifier according to claim 1, embodied in a device capable of operation in a wireless communications system.

15. The multi-mode radio frequency amplifier according to claim 1, embodied in a device capable of operation in a global system for mobile communication (GSM) network.

16. A multi-band radio frequency receiver that comprises an amplifier, said amplifier comprising a plurality of input transistors, each individual one of said input transistors comprising an output terminal and an input terminal for inputting a received signal in an associated frequency band; a plurality of output branches each comprising a load, individual ones of said loads being adapted for use with one of the associated frequency bands; and a switching stage interposed between said output terminals of said plurality of input transistors and said plurality of output branches;
   where each of said loads is one of an operating load or a non-operating load depending on a particular band of frequencies that is being received,
   where a gain of said amplifier is maximized when receiving a particular band of frequencies by said switching stage steering a total signal current at the output terminal of the input transistor associated with the particular band of frequencies to the associated operating load, and
   where the gain of said amplifier is reduced when receiving the particular band of frequencies by said switching stage steering a portion of the total signal current at the output terminal of the input transistor associated with the particular band of frequencies to a non-operating load.

17. The multi-band radio frequency receiver according to claim 16, where a first one of said plurality of loads comprises a bandpass filter having a filtering characteristic to pass signals within a first frequency band, and where a second one of said plurality of loads comprises a bandpass filter having a filtering characteristic to pass signals within a second frequency band.

18. The multi-band radio frequency receiver according to claim 16, where individual ones of said plurality of loads comprise a resonant circuit comprised of at least one capacitance and at least one inductance.

19. The multi-band radio frequency receiver according to claim 16 where individual ones of said plurality of loads comprise a surface acoustic wave filter.

20. The multi-band radio frequency receiver according to claim 16, where individual ones of said plurality of loads comprise a dielectric filter.

21. The multi-band radio frequency receiver according to claim 16, where individual ones of said plurality of input transistors have a terminal connected to ground via an associated inductance.

22. The multi-band radio frequency receiver according to claim 16, where individual ones of said plurality of input transistors are comprised of a plurality of parallel connected transistors.

23. The multi-band radio frequency receiver according to claim 16, where said switching stage is comprised of at least one transistor.

24. The multi-band radio frequency receiver according to claim 16, where said switching stage is comprised of at least one transistor pair.

25. The multi-band radio frequency receiver according to claim 16, embodied in a device capable of operation in a wireless communications system, such as in a global system for mobile communication (GSM) network.

26. The multi-band radio frequency receiver according to claim 16, where said switching stage is comprised of a plurality of switching elements controlled by binary control signals.

27. The multi-band radio frequency receiver according to claim 16, where said switching stage is comprised of a plurality of elements controlled by control voltages.

28. The multi-band radio frequency receiver according to claim 16, where input terminals of said input transistors input a differential received signal.

* * * * *